US012651880B2

(12) United States Patent
Blanck

(10) Patent No.: US 12,651,880 B2
(45) Date of Patent: Jun. 9, 2026

(54) ULTRASONICALLY BONDING A FLEXIBLE ELECTRONIC CIRCUIT ELEMENT HAVING A PLURALITY OF VIAS

(71) Applicant: ST. JUDE MEDICAL, CARDIOLOGY DIVISION, INC., St. Paul, MN (US)

(72) Inventor: Arthur G. Blanck, Ramona, CA (US)

(73) Assignee: St. Jude Medical, Cardiology Division, Inc., St. Paul, MN (US)

( * ) Notice: Subject to any disclaimer, the term of this patent is extended or adjusted under 35 U.S.C. 154(b) by 218 days.

(21) Appl. No.: 17/675,397

(22) Filed: Feb. 18, 2022

(65) Prior Publication Data

US 2022/0329029 A1     Oct. 13, 2022

Related U.S. Application Data

(60) Provisional application No. 63/173,850, filed on Apr. 12, 2021.

(51) Int. Cl.
B23K 20/10 (2006.01)
B23K 1/00 (2006.01)
(Continued)

(52) U.S. Cl.
CPC ........... H01R 43/02 (2013.01); B23K 1/0016 (2013.01); B23K 1/06 (2013.01); H01R 12/61 (2013.01);
(Continued)

(58) Field of Classification Search
CPC ........ B23K 1/0016; B23K 1/06; B23K 20/10; B23K 2101/36; B23K 2101/42;
(Continued)

(56) References Cited

U.S. PATENT DOCUMENTS 3,838,984 A * 10/1974 Crane .................... H05K 1/113
257/668
4,978,639 A * 12/1990 Hua .................. H01L 21/76898
148/DIG. 135
(Continued)

FOREIGN PATENT DOCUMENTS

JP          2006303354 A  * 11/2006

*Primary Examiner* — Keith Walker
*Assistant Examiner* — Carlos J Gamino
(74) *Attorney, Agent, or Firm* — Wiley Rein LLP

(57) ABSTRACT

A first flexible electronic circuit includes a non-conductive substrate and a conductive trace layer, including a bonding pad, on a surface of the non-conductive substrate. A second flexible electronic circuit likewise includes a substrate and a conductive trace layer, including a bonding pad, on a surface of the non-conductive substrate. The second flexible electronic circuit also includes a conductive interface layer on an opposite surface of the non-conductive substrate to the bonding pad. A plurality of vias, filled with conductive material, extend through the substrate of the second flexible electronic circuit and couple the conductive interface layer to the bonding pad. The bonding pads are brought in contact with each other, and energy (e.g., ultrasonic energy or thermal energy) is applied to the conductive interface layer until the bonding pads are bonded (e.g., ultrasonically welded or soldered) to each other.

10 Claims, 5 Drawing Sheets

(51) Int. Cl.

| | |
|---|---|
| *B23K 1/06* | (2006.01) |
| *H01R 12/61* | (2011.01) |
| *H01R 43/02* | (2006.01) |
| *H05K 1/11* | (2006.01) |
| *B23K 101/36* | (2006.01) |
| *B23K 103/00* | (2006.01) |
| *H05K 1/03* | (2006.01) |

(52) U.S. Cl.
CPC ......... *H01R 43/0207* (2013.01); *H05K 1/118* (2013.01); *B23K 2101/36* (2018.08); *B23K 2103/42* (2018.08); *H05K 1/0346* (2013.01); *H05K 2201/0154* (2013.01)

(58) Field of Classification Search
CPC .......... B23K 2103/172; B23K 2103/42; H01R 12/61; H01R 43/02; H01R 43/0207; H05K 1/0346; H05K 1/118; H05K 2201/0154; H05K 3/363; H05K 2201/058; H05K 1/112–116; H05K 3/36–368
See application file for complete search history.

(56) References Cited

U.S. PATENT DOCUMENTS

| | | | | |
|---|---|---|---|---|
| 5,398,863 | A * | 3/1995 | Grube ................. | H10W 72/701 |
| | | | | 228/180.21 |
| 6,226,862 | B1 * | 5/2001 | Neuman ................ | H05K 3/363 |
| | | | | 219/616 |
| 6,523,734 | B1 * | 2/2003 | Kawai ................... | H01R 12/52 |
| | | | | 228/110.1 |
| 10,687,415 | B2 * | 6/2020 | Wang ................... | H05K 1/0245 |
| 2001/0040794 | A1 * | 11/2001 | Shimizu .............. | H05K 3/4617 |
| | | | | 174/254 |
| 2003/0019846 | A1 * | 1/2003 | Sinkunas ............. | B23K 1/0056 |
| | | | | 219/121.85 |
| 2003/0211234 | A1 * | 11/2003 | Kurita ................... | H05K 3/361 |
| | | | | 29/830 |
| 2004/0055784 | A1 * | 3/2004 | Joshi ................... | B23K 1/0008 |
| | | | | 174/254 |
| 2006/0012920 | A1 * | 1/2006 | Kobae ................... | H05K 3/363 |
| | | | | 360/245.9 |
| 2006/0068613 | A1 * | 3/2006 | Tsukada ................ | H05K 1/028 |
| | | | | 439/67 |
| 2008/0136021 | A1 * | 6/2008 | Yang ........................ | H01L 23/13 |
| | | | | 257/737 |
| 2010/0059254 | A1 * | 3/2010 | Sugiyama .............. | H05K 3/361 |
| | | | | 219/617 |
| 2011/0000700 | A1 * | 1/2011 | Sato ......................... | H01R 4/04 |
| | | | | 174/250 |
| 2011/0124154 | A1 * | 5/2011 | Yang ....................... | H05K 1/142 |
| | | | | 438/107 |
| 2012/0235764 | A1 * | 9/2012 | Kang .................... | H05K 1/0253 |
| | | | | 29/846 |
| 2016/0037638 | A1 * | 2/2016 | Inamori ................ | H05K 1/116 |
| | | | | 174/254 |
| 2017/0048977 | A1 * | 2/2017 | Siddique ................ | H01L 24/83 |
| 2017/0252555 | A1 * | 9/2017 | Greenberg ............. | H01L 21/50 |
| 2018/0192518 | A1 * | 7/2018 | Otsubo .................... | B32B 7/08 |
| 2018/0289356 | A1 | 10/2018 | Buesseler et al. | |
| 2019/0036247 | A1 * | 1/2019 | Hirasawa ............. | H01R 43/205 |
| 2019/0223289 | A1 * | 7/2019 | Kim ................... | G02F 1/13452 |
| 2020/0282660 | A1 * | 9/2020 | Jang ...................... | G02F 1/1303 |
| 2020/0323584 | A1 * | 10/2020 | Daly .................... | A61B 18/00 |
| 2021/0274645 | A1 * | 9/2021 | Hong ................... | H05K 1/0219 |
| 2021/0410269 | A1 * | 12/2021 | Ohata ................... | H05K 1/147 |
| 2022/0083893 | A1 * | 3/2022 | Martinis ............... | H05K 1/147 |
| 2022/0087022 | A1 * | 3/2022 | Martinis ............... | H05K 1/028 |
| 2022/0125408 | A1 * | 4/2022 | Férin ................... | A61B 8/4477 |
| 2022/0329040 | A1 * | 10/2022 | Costi .................... | H05K 1/113 |
| 2023/0199971 | A1 * | 6/2023 | Perna ................... | H05K 1/111 |
| | | | | 361/749 |
| 2024/0049392 | A1 * | 2/2024 | Martinis ............... | H05K 1/115 |
| 2024/0136740 | A1 * | 4/2024 | Yamada ................. | H01R 12/61 |

* cited by examiner

ULTRASONICALLY BONDING A FLEXIBLE ELECTRONIC CIRCUIT ELEMENT HAVING A PLURALITY OF VIAS

CROSS-REFERENCE TO RELATED APPLICATIONS

This application claims the benefit of U.S. provisional application No. 63/173,850, filed 12 Apr. 2021, which is hereby incorporated by reference as though fully set forth herein.

BACKGROUND

The present disclosure relates generally to catheters that are used in the human body. In particular, the present disclosure relates to flexible electronic circuits, such as may be incorporated into an intravascular catheter, for example within the tip of such a catheter. Even more specifically, the instant disclosure relates to methods for bonding elements of such flexible electronic circuits together.

Catheters are used for an ever-growing number of procedures. For example, catheters are used for diagnostic, therapeutic, and ablative procedures, to name just a few examples. Typically, the catheter is manipulated through the patient's vasculature and to the intended site, for example, a site within the patient's heart.

It is known to incorporate various electronic components into the tips of intravascular catheters. For instance, piezo-electric ultrasound transducers and supported electronics packages (implemented, for example, as an application-specific integrated circuit (ASIC) or field-programmable gate array (FPGA)) may be mounted within the tip of an intracardiac echocardiography (ICE) catheter, such as disclosed in United States patent application publication no. 2018/0289356 and U.S. provisional application No. 62/987,574, both of which are hereby incorporated by reference as though fully set forth herein.

The relatively small size of such components, however, increases the complexity, and therefore the cost, of manufacture. One challenge in this regard is how to bond flexible circuit elements to each other (e.g., to bond the transducer flex to a wiring harness flex).

BRIEF SUMMARY

Disclosed herein is a method for bonding flexible electronic circuits to each other. The method includes: providing a first flexible electronic circuit that includes a first non-conductive substrate and a first conductive trace layer disposed on a surface of the non-conductive substrate, the first conductive trace layer including a first bonding pad; providing a second flexible electronic circuit that includes a second non-conductive substrate having a first surface and a second surface opposite the first surface and including a plurality of vias extending from the first surface to the second surface, a second conductive trace layer disposed on the first surface of the non-conductive substrate, the second conductive trace layer including a second bonding pad, a conductive interface layer disposed on the second surface of the non-conductive substrate, and a plurality of conductive fillers respectively disposed within the plurality of vias to establish a mechanical energy path between the conductive interface layer and the second conductive trace layer; placing the first conductive bonding pad in contact with the second conductive bonding pad; and applying sufficient energy to the conductive interface layer to bond the first conductive bonding pad to the second conductive bonding pad.

In aspects of the disclosure, the first flexible electronic circuit also includes a first non-conductive cover layer over the first conductive trace layer, wherein the first bonding pad remains exposed through the first non-conductive cover layer. In some embodiments, only the first bonding pad of the first conductive trace layer is exposed through the first non-conductive cover layer.

Similarly, the second flexible electronic circuit can include a second non-conductive cover layer over the second conductive trace layer, wherein the second bonding pad remains exposed through the second non-conductive cover layer. In some embodiments, only the second bonding pad of the second conductive trace layer is exposed through the second non-conductive cover layer.

The step of applying sufficient energy to the conductive interface layer to bond the first conductive bonding pad to the second conductive bonding pad can include applying sufficient ultrasonic energy to the conductive interface layer to bond the first conductive bonding pad to the second conductive bonding pad. This, in turn, can include: bringing an ultrasonic horn into contact with the conductive interface layer; activating the ultrasonic horn; and deactivating the ultrasonic horn after the first conductive bonding pad has become ultrasonically welded to the second conductive bonding pad.

In alternative embodiments of the disclosure, the step of applying sufficient energy to the conductive interface layer to bond the first conductive bonding pad to the second conductive bonding pad can include applying sufficient thermal energy to the conductive interface layer to bond the first conductive bonding pad to the second conductive bonding pad. This, in turn, can include: bringing a heating element into contact with the conductive interface layer; activating the heating element; and deactivating the heating element after the first conductive bonding pad has become soldered to the second conductive bonding pad.

It is contemplated that at least one of the first non-conductive substrate and the second non-conductive substrate can include polyimide.

The step of providing a second flexible electronic circuit can include: forming the second non-conductive substrate; forming the plurality of vias in the second non-conductive substrate; filling the plurality of vias with a conductive material; forming the second conductive trace layer, including the second bonding pad, on the first surface of the second non-conductive substrate; and forming the conductive interface layer on the second surface of the second non-conductive substrate. According to aspects of the disclosure, it can further include forming a non-conductive cover layer over the second conductive trace layer, excluding the second bonding pad. As described above, in some embodiments, only the second bonding pad is excluded.

Also disclosed herein is a flexible electronic circuit, including: a non-conductive substrate having a first surface and a second surface opposite the first surface and including a plurality of vias extending from the first surface to the second surface; a conductive trace layer disposed on the first surface of the non-conductive substrate, the conductive trace layer including a bonding pad; a conductive interface layer disposed on the second surface of the non-conductive substrate; and a plurality of conductive fillers respectively disposed within the plurality of vias to establish a mechanical energy path between the conductive interface layer and the conductive trace layer.

The flexible electronic circuit can also include a non-conductive cover layer over the conductive trace layer, wherein the bonding pad remains exposed through the non-conductive cover layer. In embodiments, only the bonding pad remains exposed through the non-conductive cover layer.

The substrate can include polyimide.

The instant disclosure also provides a flexible electronic circuit formed according to a process including the following steps: providing a first flexible electronic circuit element, wherein the first flexible electronic circuit element includes a first non-conductive substrate and a first conductive trace layer disposed on a surface of the first non-conductive substrate, the first conductive trace layer including a first bonding pad; providing a second flexible electronic circuit element, wherein the second flexible electronic circuit element includes a second non-conductive substrate having a first surface and a second surface opposite the first surface and including a plurality of vias extending from the first surface to the second surface, a second conductive trace layer disposed on the first surface of the second non-conductive substrate, the second conductive trace layer including a second bonding pad, a conductive interface layer disposed on the second surface of the second non-conductive substrate, and a plurality of conductive fillers respectively disposed within the plurality of vias to establish a mechanical energy path between the conductive interface layer and the second conductive trace layer; placing the first conductive bonding pad in contact with the second conductive bonding pad; and applying sufficient energy to the conductive interface layer to bond the first conductive bonding pad to the second conductive bonding pad.

The step of applying sufficient energy to the conductive interface layer to bond the first conductive bonding pad to the second conductive bonding pad can include applying sufficient ultrasonic energy to the conductive interface layer to ultrasonically weld the first conductive bonding pad to the second conductive bonding pad. This, in turn, can include: bringing an ultrasonic horn into contact with the conductive interface layer; activating the ultrasonic horn; and deactivating the ultrasonic horn after the first conductive bonding pad has become ultrasonically welded to the second conductive bonding pad.

In alternative aspects of the disclosure, the step of applying sufficient energy to the conductive interface layer to bond the first conductive bonding pad to the second conductive bonding pad can include applying sufficient thermal energy to the conductive interface layer to solder the first conductive bonding pad to the second conductive bonding pad. This, in turn, can include: bringing a heating element into contact with the conductive interface layer; activating the heating element; and deactivating the heating element after the first conductive bonding pad has become soldered to the second conductive bonding pad.

The foregoing and other aspects, features, details, utilities, and advantages of the present invention will be apparent from reading the following description and claims, and from reviewing the accompanying drawings.

While multiple embodiments are disclosed, still other embodiments of the present disclosure will become apparent to those skilled in the art from the following detailed description, which shows and describes illustrative embodiments. Accordingly, the drawings and detailed description are to be regarded as illustrative in nature and not restrictive.

DETAILED DESCRIPTION

Aspects of the instant disclosure relate to flexible electronic circuits, such as may be used for components integrated into the distal ends of intravascular catheters (e.g., positioned within the distal tip assemblies of such catheters). Those of ordinary skill in the art will appreciate that the teachings herein can be applied to good advantage in connection with various types of catheters, including, but not limited to, intracardiac echocardiography (ICE) catheters.

Figure 1:
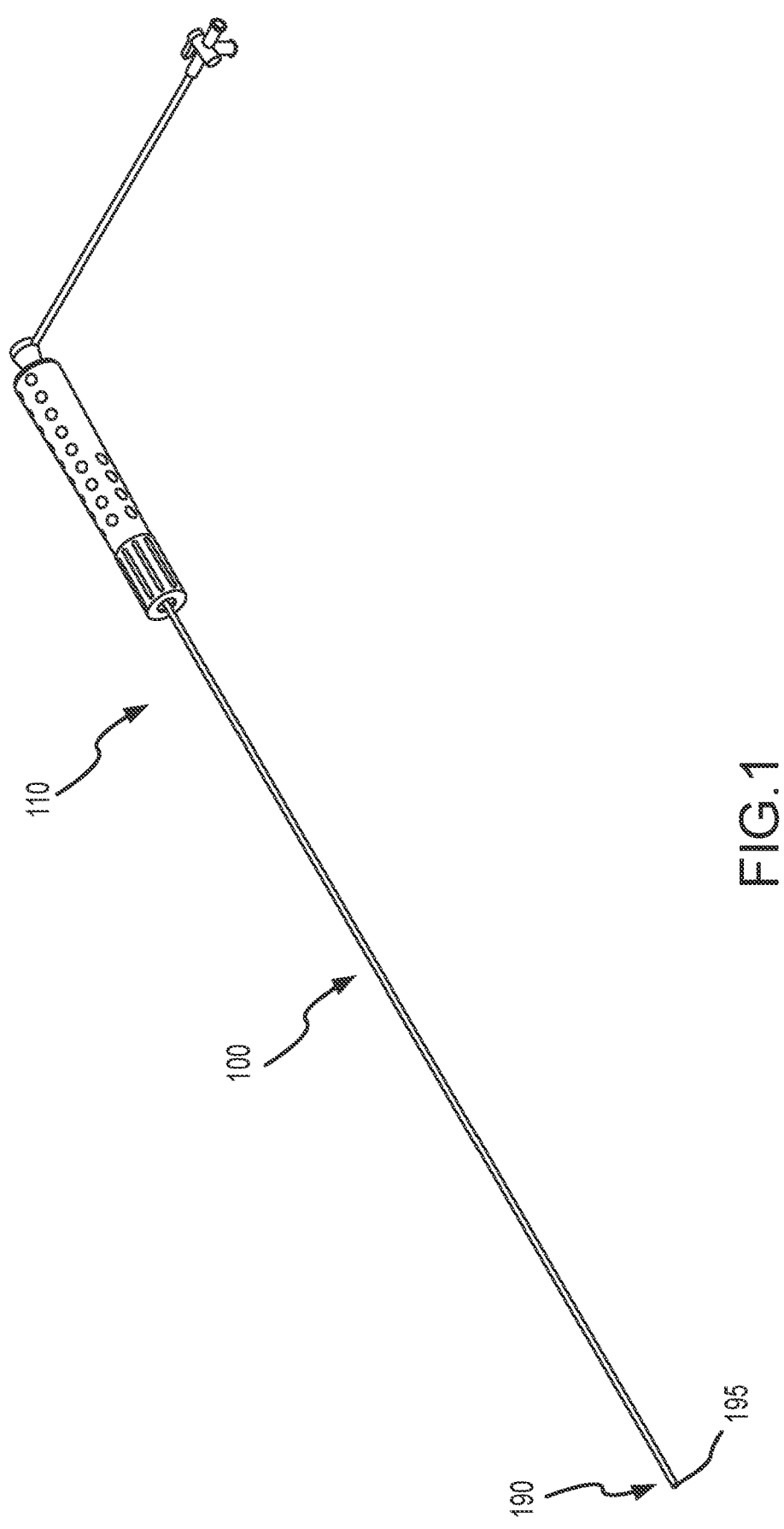
FIG. 1 is a perspective view of a representative catheter according to aspects of the instant disclosure.

For purposes of illustration, FIG. 1 depicts a perspective view of a representative catheter 100, including a shaft 105 having a proximal portion 110 and a distal portion 190, which terminates in a tip 195. Insofar as the basic construction of catheter 100 will be familiar to those of ordinary skill in the art, the details thereof will be omitted herein, except to the extent relevant to an understanding of the instant disclosure.

Figure 2:
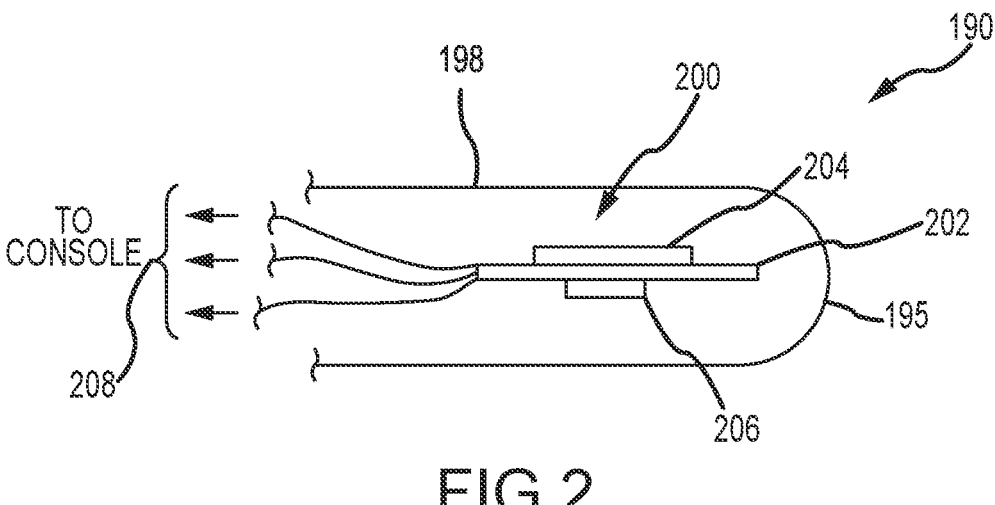
FIG. 2 schematically illustrates the distal region of the representative catheter of FIG. 1, including the interior of the tip portion.

FIG. 2 is a schematic representation of the interior of distal portion 190 of catheter 100, including tip 195. Tip 195 can include a shell 198 and a flexible electronic circuit 200 disposed within shell 198.

Flexible electronic circuit 200, in turn, includes a flexible substrate 202 and a transducer package (e.g., electronics package 204 and ultrasound transducer assembly 206) mounted to substrate 202. Suitable materials for flexible substrate 202 include, without limitation, polyimide and nylon. A wiring harness 208, which itself can include one or more flexible electronic circuits, interconnects flexible electronic circuit 200 to an external device, such as an electro-anatomical mapping system (e.g., the EnSite Precision™ Cardiac Mapping System, or the EnSite™ X electrophysiology system, both of Abbott Laboratories) or a catheter interface module.

Those of ordinary skill in the art will appreciate that there are challenges associated with bonding flexible electronic circuits to each other. Aspects of the disclosure relate to overcoming these challenges and, for purposes of illustration only, will be described with reference to bonding flexible electronic circuit 200 to wiring harness 208.

Figure 3:
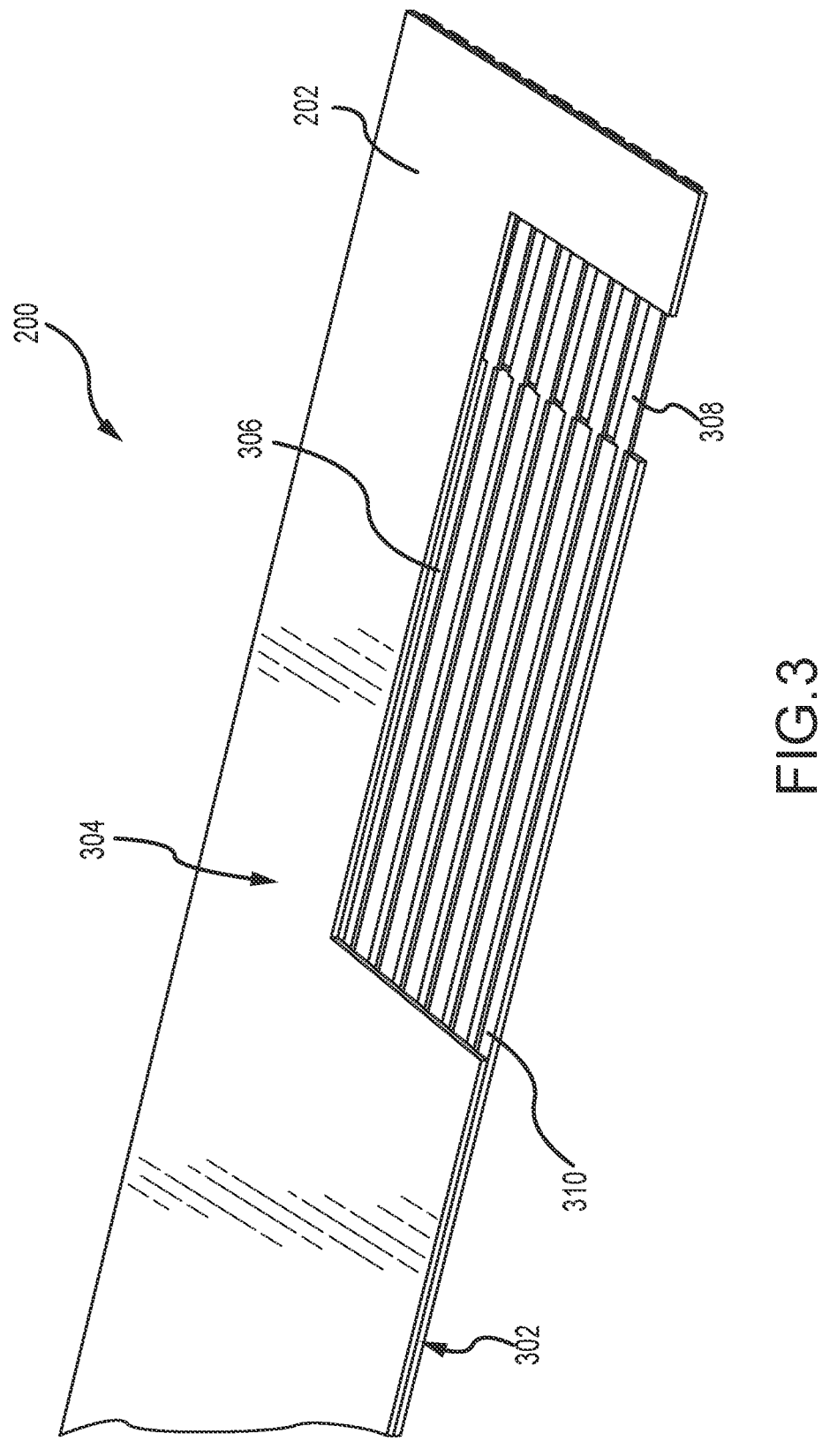
FIG. 3 illustrates a first flexible electronic circuit according to aspects of the instant disclosure, with various aspects cut away to show details.

FIG. 3 illustrates flexible electronic circuit 200 in further detail. Non-conductive (e.g., polyimide or nylon) substrate 202 of flexible electronic circuit 200 includes a first generally planar surface 302 and a second generally planar surface 304 opposite first surface 302. A conductive trace layer 306 is disposed on first surface 302, with a portion of conductive trace layer 306 forming a bonding pad 308. Those of ordinary skill in the art will also recognize that additional conductive traces may be disposed on second surface 304 (e.g., to provide electrically-conductive coupling to electronics mounted to second surface 304).

Figure 4:
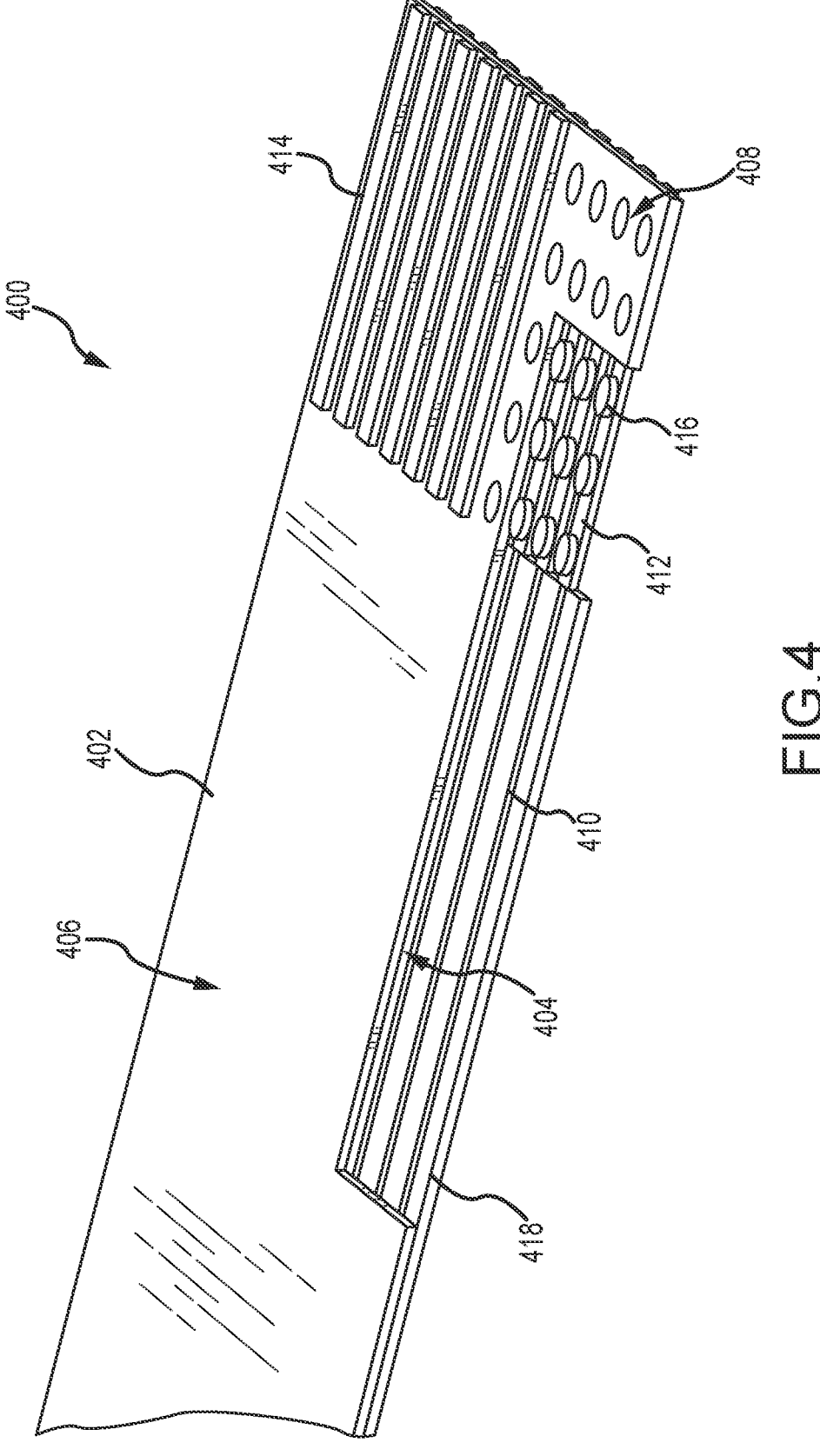
FIG. 4 illustrates a second flexible electronic circuit according to aspects of the instant disclosure, with various aspects cut away to show details.

FIG. 4 illustrates a second flexible electronic circuit 400, such as wiring harness 208, in further detail. Like flexible electronic circuit 300, flexible electronic circuit 400 includes a non-conductive (e.g., polyimide or nylon) substrate 402 having a first generally planar surface 404 and a second generally planar surface 406 opposite first surface 404. A plurality of vias 408 extend from first surface 404, through substrate 402, to second surface 406. A conductive trace layer 410 is disposed on first surface 404, with a portion of conductive trace layer 410 forming a bonding pad 412. As with flexible electronic circuit 200, those of ordinary skill in the art will also recognize that additional conductive traces may be disposed on second surface 406 (e.g., to provide electrically-conductive coupling to electronics mounted to second surface 406). A conductive interface layer 414 is also disposed on second surface 406.

Vias 408 are filled with conductive fillers 416. In particular, conductive fillers mechanically, electrically, and thermally couple conductive trace layer 410, and specifically bonding pad 412, on first surface 404 with conductive interface layer 414 on second surface 406.

Figure 5:
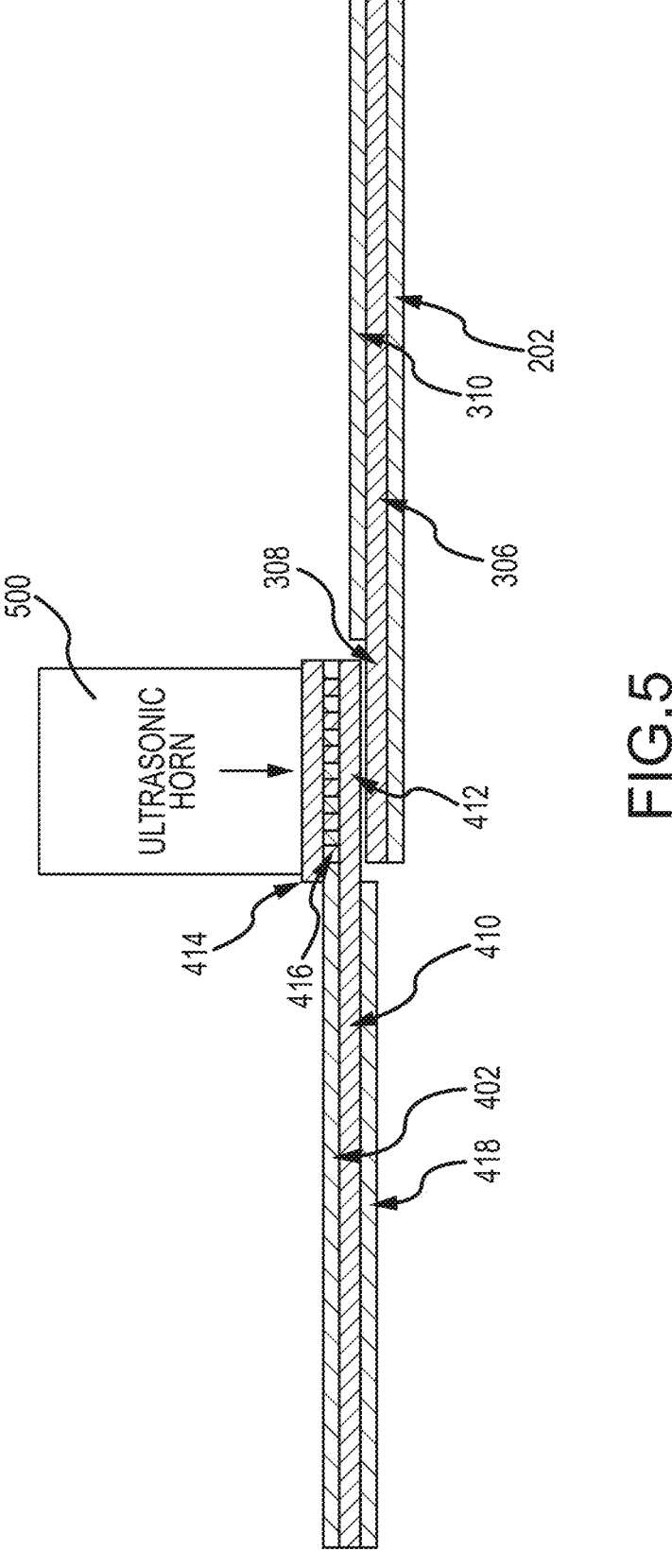
FIG. 5 schematically illustrates the process of bonding the first flexible electronic circuit shown in FIG. 3 to the second flexible electronic circuit shown in FIG. 4.

To join flexible electronic circuit 200 to flexible electronic circuit 400, bonding pads 308 and 412 are brought into contact, such as shown in FIG. 5. Sufficient energy must then be applied in order to bond (e.g., ultrasonically weld) bonding pads 308 and 412 to each other. This energy is typically applied at second surface 406 of flexible electronic circuit 400, for example by bringing an ultrasonic horn 500 into contact with second surface 406, and more particularly into contact with conductive interface layer 414, and then activating ultrasonic horn 500.

When ultrasonic horn 500 is activated, the ultrasonic energy it emits is mechanically transferred through conductive interface layer 414 and conductive fillers 416 to bonding pad 412. After application of sufficient energy, which may be on the order of hundreds of milliseconds in duration, bonding pad 412 will be ultrasonically welded to bonding pad 308 due to the differential movement and resultant frictional heat therebetween, at which point ultrasonic horn 500 can be deactivated.

As the ordinarily-skilled artisan will appreciate, absent conductive interface layer 414 and conductive fillers 416, substrate 402 of flexible electronic circuit 400 would form a difficult-to-overcome dampening layer that would complicate the formation of an ultrasonic weld between bonding pads 308 and 412. While this complication can sometimes be overcome by removing substrate 402 in the area of bonding pad 412, thus allowing ultrasonic horn 500 to come into direct contact therewith, it may not be desirable to remove substrate 402 in a thin flexible electronic circuit, because doing so may compromise the structural integrity of flexible electronic circuit 400.

Accordingly, the instant disclosure facilitates the process of ultrasonically welding thin flexible electronic circuits to each other without compromising the structural integrity thereof.

To further enhance the structural integrity of flexible electronic circuits 200, 400, either or both may include a non-conductive (e.g., polyimide) cover layer 310 or 418 over its respective conductive trace layer 306, 410, as shown in FIGS. 3 and 4, respectively. Of course, bonding pads 308 and 412 should remain exposed through cover layer 310, 418; in some embodiments, only bonding pads 308 and 412 remain exposed therethrough.

Although several embodiments have been described above with a certain degree of particularity, those skilled in the art could make numerous alterations to the disclosed embodiments without departing from the spirit or scope of this invention.

For example, in alternative embodiments of the disclosure, a thermal bonding process, such as a hot bar soldering process, can be used in place of the ultrasonic welding process described above, with conductive fillers 416 allowing the transfer of thermal energy from its point of application (e.g., second surface 406, and more particularly conductive interface layer 414) to the bonding point (e.g., the interface between bonding pads 308 and 412).

All directional references (e.g., upper, lower, upward, downward, left, right, leftward, rightward, top, bottom, above, below, vertical, horizontal, clockwise, and counterclockwise) are only used for identification purposes to aid the reader's understanding of the present invention, and do not create limitations, particularly as to the position, orientation, or use of the invention. Joinder references (e.g., attached, coupled, connected, and the like) are to be construed broadly and may include intermediate members between a connection of elements and relative movement between elements. As such, joinder references do not necessarily infer that two elements are directly connected and in fixed relation to each other.

It is intended that all matter contained in the above description or shown in the accompanying drawings shall be interpreted as illustrative only and not limiting. Changes in detail or structure may be made without departing from the spirit of the invention as defined in the appended claims.

What is claimed is:

1. A method for bonding flexible electronic circuits to each other, comprising:

providing a first flexible electronic circuit, wherein the first flexible electronic circuit comprises:
a first non-conductive substrate; and
a first conductive trace layer disposed on a surface of the first non-conductive substrate, the first conductive trace layer including a first bonding pad;

providing a second flexible electronic circuit, wherein the second flexible electronic circuit comprises:
a second non-conductive substrate having a first surface and a second surface opposite the first surface and including a plurality of vias extending from the first surface to the second surface;
a second conductive trace layer disposed on the first surface of the second non-conductive substrate, the second conductive trace layer including a second bonding pad;
a conductive interface layer disposed on the second surface of the second non-conductive substrate; and
a plurality of conductive fillers respectively disposed within and completely filling the plurality of vias to establish a mechanical, electrical, and thermal coupling between the conductive interface layer and the second bonding pad;

placing the first bonding pad in direct contact with the second bonding pad; and applying sufficient ultrasonic energy to the conductive interface layer to bond the first bonding pad to the second bonding pad by:
bringing an ultrasonic horn into contact with the conductive interface layer;
activating the ultrasonic horn; and
deactivating the ultrasonic horn after the first bonding pad has become ultrasonically bonded to the second bonding pad.

2. The method according to claim 1, wherein the first flexible electronic circuit further comprises a first non-conductive cover layer over the first conductive trace layer, and wherein the first bonding pad remains exposed through the first non-conductive cover layer.

3. The method according to claim 2, wherein only the first bonding pad of the first conductive trace layer is exposed through the first non-conductive cover layer.

4. The method according to claim 1, wherein the second flexible electronic circuit further comprises a second non-conductive cover layer over the second conductive trace layer, and wherein the second bonding pad remains exposed through the second non-conductive cover layer.

5. The method according to claim 4, wherein only the second bonding pad of the second conductive trace layer is exposed through the second non-conductive cover layer.

6. The method according to claim 1, wherein at least one of the first non-conductive substrate and the second non-conductive substrate comprises polyimide.

7. The method according to claim 1, wherein providing the second flexible electronic circuit comprises:

forming the second non-conductive substrate;

forming the plurality of vias in the second non-conductive substrate;

filling the plurality of vias completely with a conductive material to form the plurality of conductive fillers;

forming the second conductive trace layer, including the second bonding pad, on the first surface of the second non-conductive substrate;

forming the conductive interface layer on the second surface of the second non-conductive substrate.

8. The method according to claim 7, further comprising forming a non-conductive cover layer over the second conductive trace layer, excluding the second bonding pad.

9. The method according to claim 8, wherein only the second bonding pad is excluded.

10. The method according to claim 1, wherein the second conductive trace layer, the conductive interface layer, and the plurality of conductive fillers are formed of identical conductive material.

* * * * *